(12) United States Patent
Sharma et al.

(10) Patent No.: US 9,496,888 B1
(45) Date of Patent: Nov. 15, 2016

(54) ASYNCHRONOUS SAR ADC WITH BINARY SCALED REDUNDANCY

(71) Applicant: Infineon Technologies AG, Neubiberg (DE)

(72) Inventors: Sunny Sharma, Singapore (SG); Chin Yeong Koh, Singapore (SG); Samaksh Sinha, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/568,239

(22) Filed: Dec. 12, 2014

(51) Int. Cl.
*H03M 1/34* (2006.01)
*H03M 1/38* (2006.01)
*H03M 1/12* (2006.01)
*H03M 1/80* (2006.01)
*H03M 1/06* (2006.01)
*H03M 1/00* (2006.01)

(52) U.S. Cl.
CPC .............. *H03M 1/38* (2013.01); *H03M 1/125* (2013.01); *H03M 1/00* (2013.01); *H03M 1/0695* (2013.01); *H03M 1/12* (2013.01); *H03M 1/804* (2013.01)

(58) Field of Classification Search
CPC ...... H03M 1/00; H03M 1/12; H03M 1/0695; H03M 1/804
USPC ............... 341/172, 155, 110, 163, 161, 158; 34/156
See application file for complete search history.

(56) References Cited

U.S. PATENT DOCUMENTS

2005/0258998 A1* 11/2005 Confalonieri ........ G11C 27/024
341/172

\* cited by examiner

*Primary Examiner* — Joseph J Lauture
(74) *Attorney, Agent, or Firm* — Shumaker & Sieffert, P.A.

(57) ABSTRACT

Representative implementations of devices and techniques provide analog to digital conversion of time-discrete analog inputs. A redundant binary scaled capacitance arrangement using a successive approximation technique can provide a fast and power efficient ADC, with improved error correction. For example, a successive approximation capacitor arrangement may include multiple arrays of capacitances with binary bit weights. In an implementation, the technique includes processing the capacitances in successive cycles, where each cycle generates a binary error correction code representing greater than one bit of the digital output.

24 Claims, 10 Drawing Sheets

ASYNCHRONOUS SAR ADC WITH BINARY SCALED REDUNDANCY

BACKGROUND

Analog-to-digital converters (ADCs) convert time-discrete analog input values to a digital form. A type of ADC, the successive approximation register (SAR) ADC, digitizes the analog input values using a successive approximation search algorithm. While the internal circuitry of the SAR ADC may run at a higher frequency (such as several megahertz (MHz), for example), the sample rate of the SAR ADC is generally a fraction of that frequency (such as several kilohertz (kHz), for example) due to the successive approximation search algorithm used. For example, normally each bit of the SAR ADC is fully realized prior to proceeding on to the next bit.

In general, each bit-weight of a successive approximation register (SAR) arrangement of a SAR ADC may be represented by a physical element (e.g., capacitor, resistor, current source, etc.). A search algorithm may be used with the physical elements to determine the closest digital approximation to an analog input value. While this technique may be simple to implement, it is not always the most power efficient or the fastest. Split-capacitor techniques can be more power efficient, but have a higher complexity. Further, control logic and/or error correction can be complex, linearity can suffer, and excessive chip area can be used for some implementations.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Figure 1:
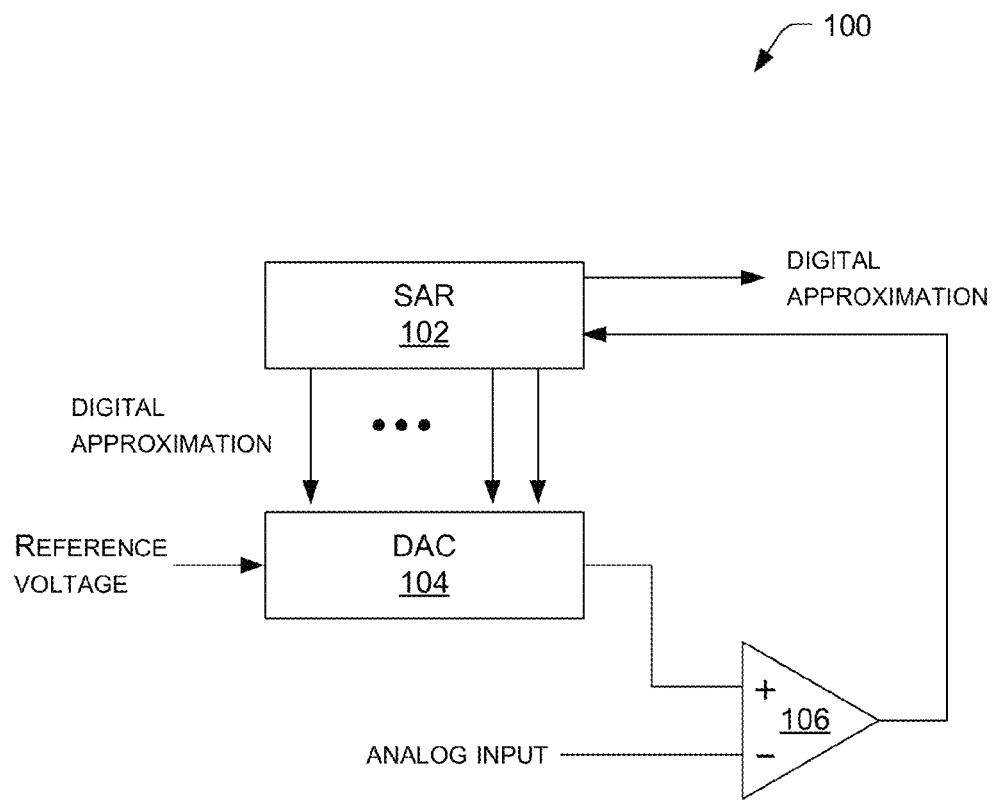
FIG. 1 is a block diagram of an example analog-to-digital converter (ADC) arrangement, wherein the techniques and devices disclosed herein may be applied, according to an implementation.

As an optimized technique, a "redundant" capacitor array arrangement can be used with a binary search algorithm as a core component of a SAR ADC. This technique provides better power efficiency (due to the capacitor array architecture) with greater error correction capability (due to the redundancy) with the simplicity of a binary search.

Representative implementations of devices and techniques provide analog to digital conversion of time-discrete analog inputs. A redundant binary scaled capacitance arrangement using a successive approximation technique can provide a fast and power efficient ADC, with improved error correction and reduced chip area. For example, in one implementation, a successive approximation capacitor arrangement may include multiple arrays of capacitances with binary bit weights (e.g., the bit weights of the capacitors in the array(s) are scaled in a binary manner).

In various implementations, sample and hold components or circuits may be used to acquire an analog input value, and to charge the capacitor array(s) with the value. The sample and hold components may include the capacitances of the array(s), for example, or may be separate circuit components. Based on a binary search algorithm, the charge on the capacitances of the array(s) can be compared to reference values, for example. The comparisons can be used to converge on a digital approximation for the analog input signal.

In an implementation, the charge on the capacitances can be processed (or compared to reference values) in successive cycles. Sets of like-weighted capacitances can be processed concurrently during a cycle. In an implementation, each cycle generates a binary error correction code representing greater than one bit of the digital output. For instance, in one implementation, the error code represents 1.5 bits of the digital output.

In an implementation, the error codes are combined to form the digital approximation of the analog input value (e.g., analog input voltage). In the implementation, the error codes are added in an overlapping arrangement that effectively corrects decision errors during cycles, based on the redundancy of the codes. In one example, at least 4 decision errors can be corrected during a 10-bit conversion cycle comprised of a series of cycles, resulting in an accurate digital approximation of the analog input.

Various implementations and techniques for an analog to digital conversion arrangement are discussed in this disclosure. Techniques and devices are discussed with reference to example analog-to-digital converter (ADC) devices and systems illustrated in the figures. In some cases, successive-approximation ADC (SAR ADC) designs are shown and discussed. However, this is not intended to be limiting, and is for ease of discussion and illustrative convenience. The techniques and devices discussed may be applied to many of various ADC device designs, structures, combinations, and the like (e.g., direct-conversion ADC, flash ADC, ramp-compare ADC, integrating ADC (also referred to as dual-slope or multi-slope ADC), counter-ramp ADC, pipeline ADC, sigma-delta ADC, time interleaved ADC, intermediate FM stage ADC, etc.), and remain within the scope of the disclosure.

Implementations are explained in more detail below using a plurality of examples. Although various implementations and examples are discussed here and below, further implementations and examples may be possible by combining the features and elements of individual implementations and examples.

Example ADC Arrangement

FIG. 1 is a block diagram of an example analog-to-digital conversion (ADC) arrangement 100, wherein the techniques and devices described herein may be applied. Analog signals ("analog input") are received on the input side, converted by a quantity of ADC components, and digital results ("digital output," "digital approximation," or "digital representation") are output from the ADC 100.

For the purposes of this disclosure, a digital result may be described as a digital approximation of an analog input. For example, a digital result may include a digital representation that is proportional to the magnitude of the voltage or current of the analog input, at a point in time and/or over a selected duration. The digital representation may be expressed in various ways (e.g., base 2 binary code, binary coded decimal, voltage values, electrical or light pulse attributes, and the like).

As shown in FIG. 1, an example ADC 100 may include a successive approximation register (SAR) component 102, a digital-to-analog converter (DAC) 104, and a comparator 106. In alternate implementations, an example ADC 100 may include fewer, additional, or alternate components.

The SAR 102 is arranged to receive the analog input signal (which may be adjusted based on the output of the DAC 104 via the comparator 106) and determine a digital approximation for the analog input signal. The SAR 102 may output the digital results in a parallel fashion (such as to the DAC 104), with each bit (of multiple bits based on the resolution of the SAR 102) outputted on an individual path. Also, the SAR 102 may output the digital results in a serial form. Both of these techniques are shown in the illustration of FIG. 1. In various implementations, the output of the SAR 102 is the digital output of the ADC 100.

Resolution of the ADC 100 may be defined based on the minimum voltage level required to cause a change in the output code of the SAR 102. For example, the minimum voltage that causes a change in the digital code is the least significant bit (LSB) of the ADC 100. The resolution of the ADC 100 is the LSB voltage. In various implementations, the SAR 102 may have 8, 10, or 12 bit resolution. In alternate implementations, the SAR 102 may have fewer or greater number of bits of resolution.

Configurations and/or arrangements for the SAR 102 and/or the DAC 104 are discussed further below. Additionally, a process of approximating a digital value for each input signal may be according to one or more processes or algorithms, as discussed further below.

The DAC 104 receives the digital output of the SAR 102, and converts it to an analog form. As shown in FIG. 1, the DAC 104 can receive the digital output of the SAR 102 via multiple bits, based on the resolution of the SAR 102. Also as shown in FIG. 1, the analog form of the digital output may be fed back, and/or combined with or compared to the analog input signal (e.g., added, subtracted, etc.). The feedback loop of the DAC 104 can provide error correction to the ADC 100, as the analog form of the digital output is compared to the analog input signal, or the like.

Additionally, the ADC 100 may include one or more sample and hold components (S/H) or circuits (not shown.) In one implementation, one or more capacitors of the SAR 102 also act as S/H components. In alternate implementations, an ADC 100 may include additional components or alternate components to perform the functions discussed, or for other desired functionality. In further implementations, the functional components or modules of the ADC 100 may be arranged or combined in a different arrangement, form, or configuration.

Example Implementation

To attain high speed and high resolution with a SAR ADC 100, it is desirable for the DAC 104 reference voltage to settle to a precision of less than of the least significant bit (LSB). Adding redundancy to a SAR ADC 100 design, can relax the DAC 104 settling time by allowing the DAC 104 to settle within a reference voltage ($V_{REFp}$)±a number of redundant bits.

In an implementation, an ADC 100 is arranged to include an asynchronous 1.5 bits per cycle architecture, in the form of a binary scaled capacitance array arrangement 200. In one example, the architecture includes a last cycle interpolation to attain a 10-bit resolution SAR ADC. In the implementation, the 1.5 bits per cycle architecture includes an inherent redundancy that allows the DAC 104 to settle within $V_{REFp}$±a number of redundant bits, while using a binary successive approximation technique. In various examples, the relaxation of the DAC 104 settling time using the technique described herein provides a reduction in the current consumption of the voltage reference buffer. In an alternate example, the sampling frequency of the ADC 100 core can be increased without increasing current consumption of the voltage reference buffer.

Figure 2:
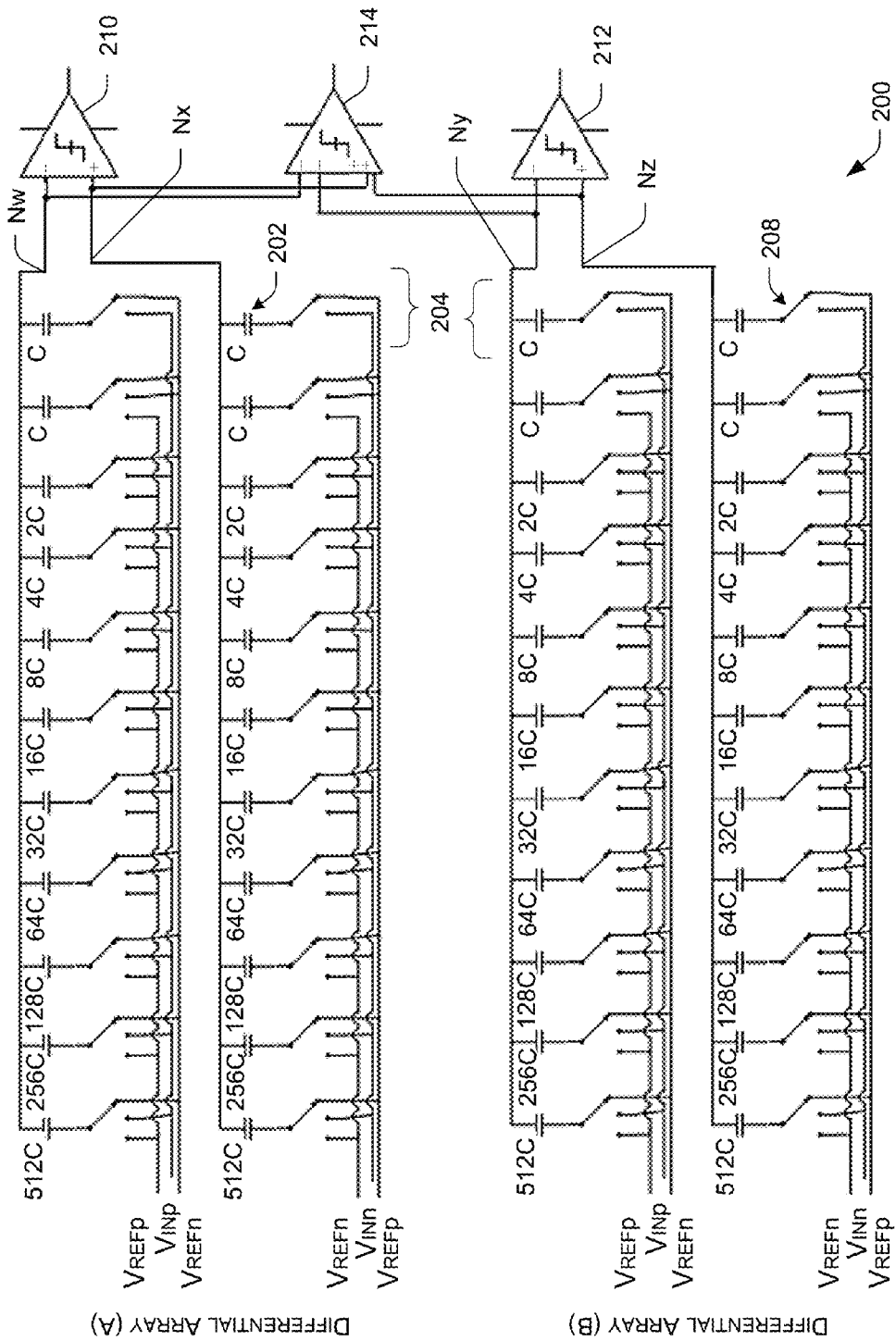
FIG. 2 is a schematic diagram of an example binary scaled capacitance array arrangement, according to an implementation. The example array arrangement is shown as having multiple arrays of correspondingly weighted capacitances at each bit position.

FIG. 2 is a schematic diagram of an example binary scaled capacitance array arrangement 200 that may be used with an arrangement of an ADC 100, according to an implementation. For example, the array arrangement 200 may be used to determine a digital approximation of an analog input when implemented with a SAR 102 and/or a DAC 104 of the ADC 100.

In the implementation illustrated in FIG. 2, the arrangement 200 is comprised of two differential arrays A and B, each comprising two arrays of parallel capacitances 202 coupled (at one terminal) to a common node (Nw, Nx, Ny, and Nz). As shown in FIG. 2, the two arrays of parallel capacitances 202 may be operated in a differential mode with respect to each differential array (A or B), with capacitance 202 pairs at each bit position 204. In alternate implementations, an arrangement 200 may be comprised of a greater number of arrays.

In the example shown in FIG. 2, an arrangement 200 includes a sequence of multiple capacitances 202 in each parallel array. In an implementation, each pair of capacitances 202 within each differential array A and B (which includes a capacitance 202 of the upper parallel array and an associated capacitance 202 of the lower parallel array) is assigned a bit weight based on a position of the pair of capacitances 202 within the arrays. For example, the assignment may be according to a predetermined binary numerical pattern, as discussed further below. In the implementation, the digital approximation for the analog input value is based on a sum of the bit weights of the pairs of capacitances that are coupled (e.g., switched) in like manner. In an example, this sum may be expressed in a binary code, such as a binary equivalent of the sum, as the output for the ADC 100.

In other words, each of the capacitances 202 of an array of parallel capacitances represents a bit position, and each capacitance 202 of the binary scaled capacitance array 200 at the bit position is processed concurrently during a cycle of the binary scaled capacitance array 200, resulting in a binary coded error correction value representing 1.5 bits.

For example, in one implementation, each parallel array of the arrangement 200 includes a set of binary-weighted capacitors 202 (512C, 256C . . . 4C, 2C, C) where the capacitance values (or binary weights) of the capacitors 202 are based on a binary sequence (e.g., powers of 2). For example, in an implementation, each capacitance in the sequence has a capacitance value that is approximately half the capacitance value of the previous adjacent capacitance. Accordingly, the first differential array A and the second differential array B of parallel capacitor arrays, in combination, are arranged to determine a digital approximation for the analog input value, as described herein.

In one implementation, each parallel array of the arrangement 200 includes an additional capacitor ("C") 202 sometimes referred to as a "dummy LSB" capacitor. As shown in FIG. 2, in some implementations, the dummy LSB capacitor has a same (or substantially equivalent) capacitance value (e.g., bit weight) as a next lowest-bit capacitance 202. For example, the dummy LSB capacitor may be used to improve the accuracy of the SAR 102 (to remedy mis-decisions at a higher bit position, for example). In alternate implementations, the dummy capacitor may have a capacitance value (e.g., bit weight) that is substantially equivalent to another of the capacitances, 202, and may have another bit position within an array other than the lowest significant bit (LSB).

In alternate implementations, an arrangement 200 may be arranged such that each bit of the array(s) of the arrangement 200 is represented by a single physical component (e.g., a capacitor, resistor, current source, or the like) or by two or more physical components ("sub-elements"). Accordingly, in various implementations, one or more of the capacitances 202 of FIGS. 2-4 may be implemented using a single component or multiple sub-elements.

In an implementation, as shown in FIG. 2, the multiple arrays of the arrangement 200 are substantially identical or equivalent. In various implementations, substantially identical or equivalent may include having the same components, having equivalent components, having components with substantially equivalent capacitance values or bit weights, and the like. For example, in each of the parallel arrays, there is an associated capacitance 202 of substantially equivalent value in the other array(s). The capacitances 202 having a substantially equivalent value may be treated as capacitance pairs or groups in some implementations.

In an implementation, as shown in FIG. 2, each capacitance 202 is switched (via a switch 208) at a second terminal of the capacitance 202. For example, as shown in the illustration, the capacitances 202 of the upper parallel array of the differential arrays A and B are switched at the second terminal amongst a first leg of a differential reference voltage (Vrefp), a second leg of the differential reference voltage (Vrefn), or the first leg of a differential analog input voltage (Vinp). The capacitances 202 of the lower parallel array of the differential arrays A and B are switched at a second terminal amongst the first leg of the differential reference voltage (Vrefp), the second leg of the differential reference voltage (Vrefn), or the second leg of the differential analog input voltage (Vinn). In various implementations, switching the capacitances 202 amongst the values shown in FIG. 2 allows the capacitances 202 to charge based on the analog input voltage, and to be compared to reference voltages during conversion cycles.

In one example, as shown in FIG. 2, the second terminal of the LSB "dummy" capacitance of the upper array of parallel capacitances of the differential arrays A and B is arranged to be switched between the second leg of the reference voltage (Vrefn) and the first leg of the analog input voltage (Vinp), and the second terminal of the LSB "dummy" capacitance of the lower array of parallel capacitances of the differential arrays A and B is arranged to be switched between the first leg of the reference voltage (Vrefp) and the second leg of the analog input voltage (Vinn). As mentioned, the switching of the capacitances 202 is used to determine the digital approximation of the analog input voltage, as further described below.

In alternate implementations, the switches 208 may be implemented with fast switching transistors, such as MOSFETS, or the like. Further, the capacitances 202 may be selected, and implemented, with devices having desired sample and hold properties, such as low leakage, fast charging, and the like.

In an implementation, each differential array (A and B) includes a comparator (210 and 212, respectively) (distinct from the comparator 106) arranged to compare the voltages at the common nodes of the attached parallel capacitance arrays, at each cycle of a conversion period. In one implementation, the digital approximation output of the ADC 100 is based on the comparisons over all of the cycles of the conversion period. For example, in an implementation, as shown in FIG. 2, the comparator 210 is arranged to compare the voltage at common node Nw to the voltage at common node Nx, and to output a logical high or logical low based on the comparison. Additionally, another comparator 212 is arranged to compare the voltage at common node Ny to the voltage at common node Nz, and to output a logical high or logical low based on the comparison. In an implementation, the output of the first comparator 210 supplies a MSB of a two-bit error code, and the output of the second comparator 212 supplies a LSB of the two-bit error code. As is described below, the outputs from the comparators 210 and 212 for each cycle are combined and used to form the digital output of the ADC 100.

In an implementation, the comparators 210, 212 perform the comparisons based on threshold values determined by an example successive approximation algorithm, as described below. In the implementation, the threshold values are propagated to the common nodes (Nw, Nx, Ny, and Nz) based on the voltage values stored on the capacitances 202 during each cycle of the conversion period.

In one implementation, the array arrangement 200 includes a third comparator 214. In the implementation, the upper common nodes (Nw and Ny) of the differential arrays A and B are coupled to a first differential input of the third comparator and the lower common nodes (Nx and Nz) of the differential arrays A and B are coupled to a second differential input of the third comparator. In an implementation, the third comparator 214 comprises an interpolation comparator used during the last cycle of multiple cycles (e.g., of the conversion period) of determining the digital approximation output.

In an implementation, the combined outputs of the comparator 210, the comparator 212, and the comparator 214 represent a binary error correction code for the last cycle of the conversion period. Accordingly, the last cycle of the conversion period generates a 2-bit error correction code.

Example Binary Redundancy Algorithm

Figure 3:
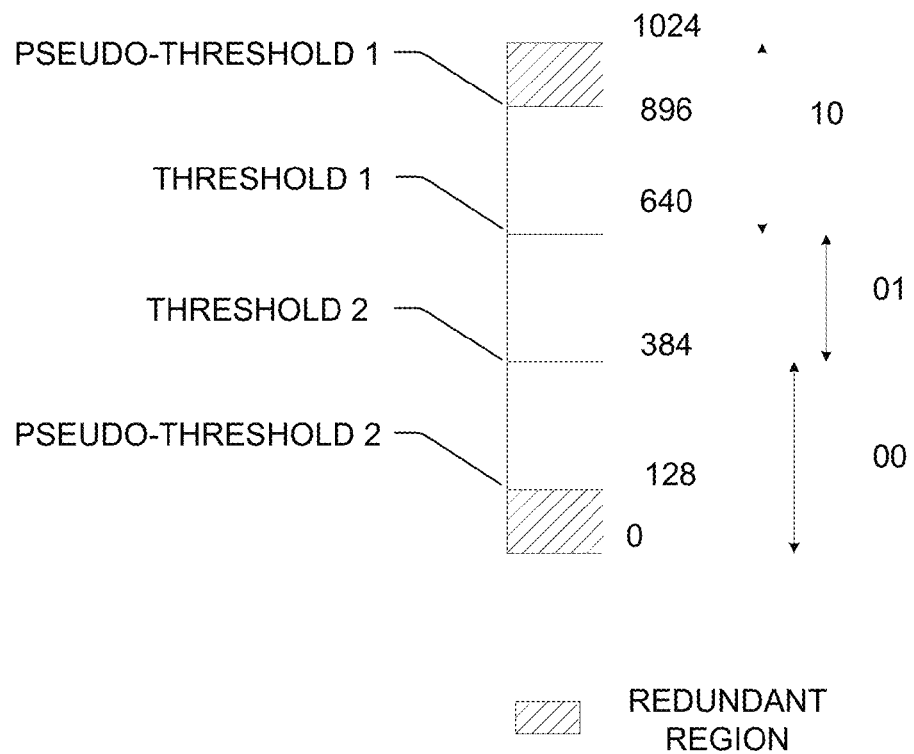
FIG. 3 illustrates an example digital range for an ADC arrangement. In the example, the digital range is defined by a quantity of equally spaced regions plus upper and lower pseudo-thresholds on either end of the equally spaced regions, according to one implementation.
Figure 4:
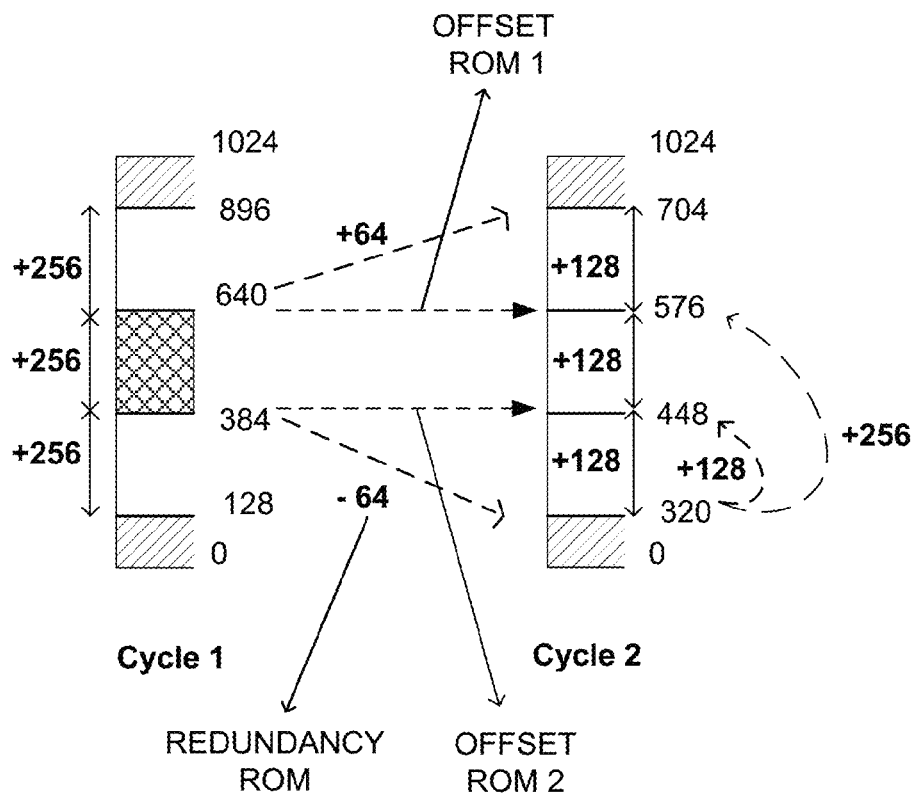
FIG. 4 shows the digital range of FIG. 3, and includes an illustrative example of determining a full scale range for a next cycle, according to an implementation.

FIG. 3 illustrates an example digital range for an ADC arrangement 100. In the example, the digital range is defined by a quantity of equally spaced regions plus upper and lower pseudo-thresholds on either end of the equally spaced regions, according to one implementation. The digital ranges of FIGS. 3 and 4 are referenced for describing an example algorithm that may be used with the ADC 100 and the array arrangement 200 for determining a digital approximation to an analog input (e.g., analog input voltage).

In various implementations, the ADC 100 may use a successive approximation (SA) algorithm, or the like, to convert sampled analog values to digital results via a binary search. An example SA algorithm is described with respect to arrangement 200 for convenience, and is also applicable to other ADC arrangements, as well as similar arrangements. The binary search is conducted through some or all possible quantization levels, and eventually converges on a digital result for the conversion.

In an implementation, the algorithm approach includes generating a 10-bit digital approximation for the input analog voltage, over a 9-cycle conversion period. This is done by adding the 2-bit error correction codes (10, 01, or 00) output from the comparators 210 and 212 (one bit from each comparator 210, 212) during each cycle, in an overlapped or offset manner. For example, in each cycle, one 2-bit error correction code is output from the comparators 210, 212. In an implementation, adding the correction codes is performed without the use of subtraction logic.

The illustration of FIG. 3 represents an example digital range of a first capacitance position, or most significant bit (MSB) position of the array arrangement 200, in preparation for a first cycle. For example, in the case of the example array arrangement 200 of FIG. 2, the MSB bit position is the 512C capacitance position. In an implementation, as shown in FIG. 3, the digital range represents a 10-bit resolution of the ADC 100, ranging from 1 to 1024 ($1024=2^{10}$). Thresholds 1 and 2 represent comparator 210 and 212 thresholds, and are arranged to determine the thresholds for the error codes (10, 01, and 00) output by the comparators 210 and 212. In the implementation, there are no comparators representing pseudo-thresholds 1 and 2. Instead, pseudo-thresholds 1 and 2 are used to offset the digital range, and for defining the boundaries of the three equally spaced regions (here the regions are 256 apart) inside the pseudo-thresholds 1 and 2.

In an implementation, the algorithm begins by adding a 128 bit offset to the capacitor array 200, on either side of the digital range, to determine the pseudo-thresholds 1 and 2. For example, this represents $\frac{1}{8}^{th}$ (128 bits) of the array 200 that is switched to either Vrefp or Vrefn, depending on the positive or negative reference side (e.g., upper or lower) of the capacitances 202, within the differential arrays A and B (as shown in FIG. 2). Based on the three regions with their corresponding error codes (10, 01, and 00), the first cycle is a 1.5 bits cycle, and the redundant regions are shown shaded (outside of the pseudo-thresholds 1 and 2).

As the conversion period progresses, redundancy bits are added to and subtracted from the upper and lower limits of the "detected region." In other words, the redundancy bits are applied to the limits of one of the three regions, where the input analog voltage is detected. The adjusted limits become the new full-scale range for the next cycle. In an implementation, the quantity of redundancy bits that are added to the upper limit and subtracted from the lower limit of the detected region is divided by 2 (i.e., a binary scaled redundancy approach) for each successive cycle. Accordingly, this increases the size of the upper and lower redundant regions, defined by the pseudo-thresholds 1 and 2 for each cycle, converging on the detected analog input value.

FIG. 4 shows the digital range of FIG. 3, and includes an example of a next cycle (e.g., Cycle 2), while illustrating a technique for determining a full scale range for the next cycle, according to an implementation. As described, the full scale range for the next cycle (cycle 2, in the illustration of FIG. 4) is determined by adding redundancy bits to the upper limit of the detected range of the previous cycle (cycle 1, in the illustration of FIG. 4) and subtracting the same quantity of redundancy bits from the lower limit of the detected range of the previous cycle. As shown in FIG. 4, the detected range for cycle 1 is between 640 and 384. Accordingly, the upper limit of the full scale for cycle 2 is 640+64=704. The lower limit of the full scale range for cycle 2 is 384−64=320. The full scale range (704−320) is divided into three equally spaced regions (which are 256/2=128 apart) in preparation for detection of the analog input voltage during cycle 2.

In an implementation, the analog input voltage is detected during each cycle within one of the defined (equally spaced) regions. The comparator 210, 212 outputs (e.g., the error codes 10, 01, or 00) for the detected region are captured for the cycle, based on the region where the analog voltage is detected. Referring to FIG. 3, the codes shown associated with the three regions carry forth with respect to the three regions throughout the remaining cycles (except for the $9^{th}$ cycle, which is explained below). This is because the codes are determined by the comparator 210, 212 thresholds 1 and 2, which are adjusted with each cycle.

Accordingly, for a next cycle (e.g., third cycle) the upper and lower full-scale limits are determined by adding and subtracting 32 bits from the limits of the detected region, and the three equally spaced regions are 64 bits apart, defining the next comparator 210, 212 thresholds (thresholds 1 and 2). This process continues until the last cycle, where the equally spaced regions (and comparator 210, 212 thresholds) are 1 bit apart.

In an implementation, a subtractor may be used to keep track of the lower full-scale limit for each cycle. In the implementation, the subtractor may not contribute to a speed reduction of the system. This is due to the use of predetermined subtraction values (based on the binary progression) that are used to determine the lower and upper limits of the full scale for the next cycle, as well as the comparator threshold values for the next cycle. In an example, the comparator threshold offsets and/or values may be stored in memory (e.g., read-only-memory (ROM), or like memory device.

In an implementation, the last bit (LSB) is resolved during the $9^{th}$ cycle of the conversion period, for 10-bit resolution. In the implementation, the $9^{th}$ cycle is a 2-bit cycle, instead of a 1.5-bit cycle. In the implementation, the additional threshold required for the middle interpolating comparator during the last cycle ($9^{th}$ cycle) is generated via transistor based interpolation.

After the last cycle of the conversion period, the error codes are combined using an offset or overlapping addition technique. In an implementation, the error codes are added such that each 2-bit code overlaps the previous cycle's 2-bit code by one bit. For example, the LSB of the previous cycle's code is added to the MSB of the next cycle's code, and so on. The result of the offset addition of the codes from 9 cycles is a 10-bit digital approximation of the analog input voltage.

Figure 5:
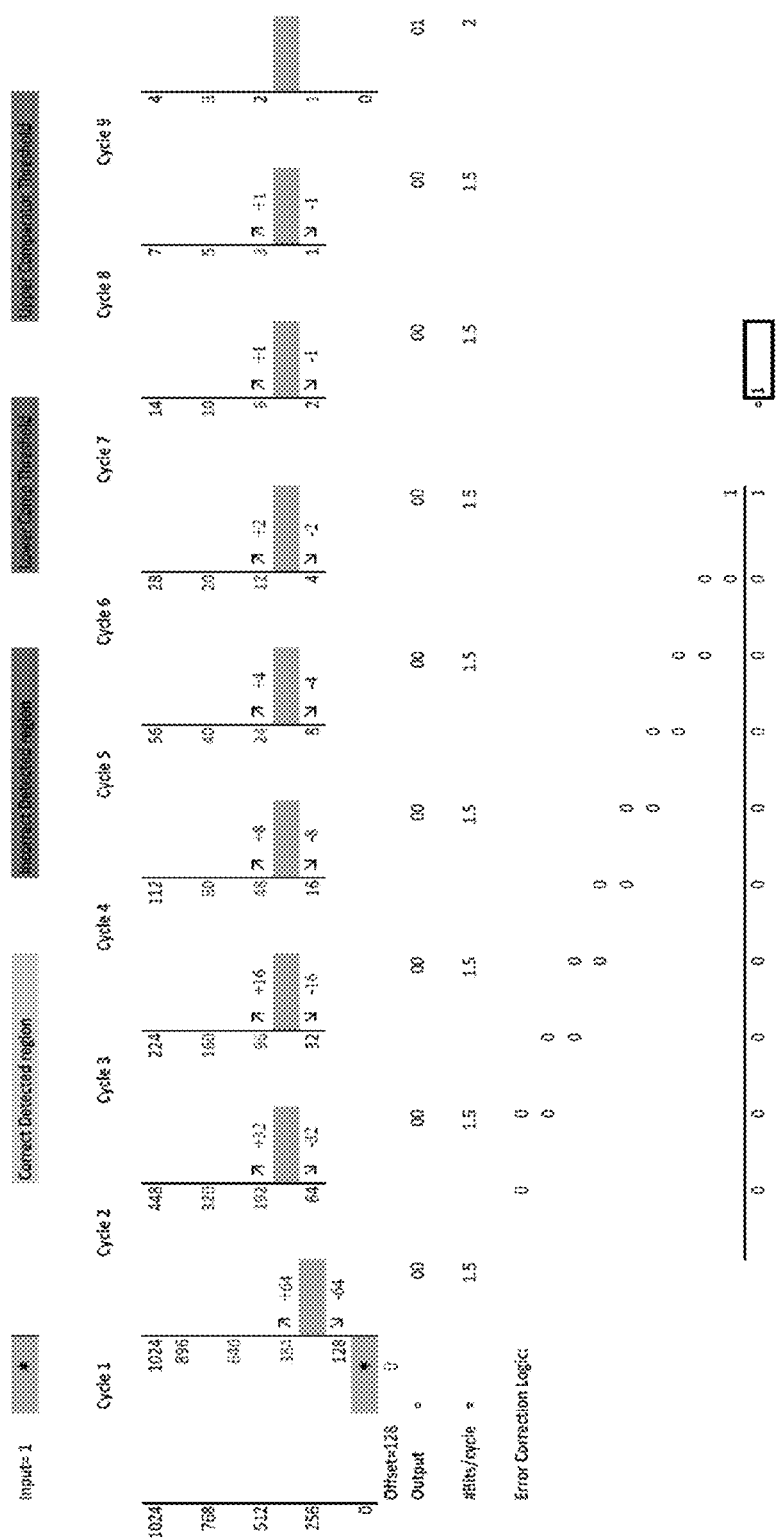
FIG. 5 is a diagram of an example conversion period, comprising a quantity of cycles, according to an implementation. The example of FIG. 5 illustrates digital conversion of a 1 mV normalized analog input, with respect to a reference voltage (Vrefp).
Figure 6:
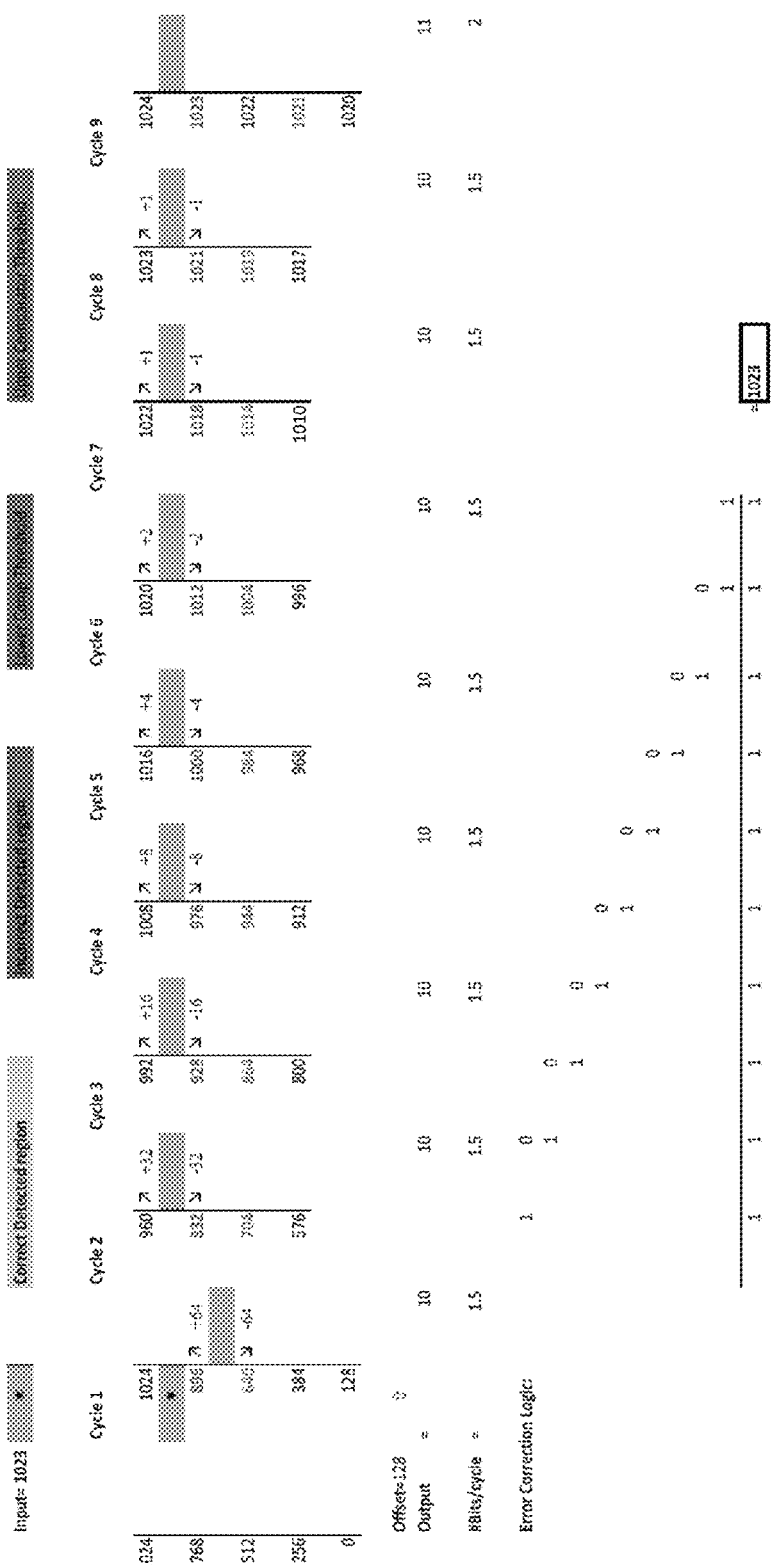
FIG. 6 is a diagram of another example conversion period, comprising a quantity of cycles, according to an implementation. The example of FIG. 6 illustrates digital conversion of a 1023 mV normalized analog input, with respect to a reference voltage (Vrefp).

FIGS. 5-8 illustrate four conversion periods of 9 cycles each, where an analog voltage is input and a 10-bit digital approximation is generated via the 9 cycles. As seen in FIGS. 5 and 6, an analog signal value of 1 mV and 1023 mV can be detected, making the dynamic range of an ADC 100 utilizing this redundancy algorithm to be a full 100%.

Figure 7:
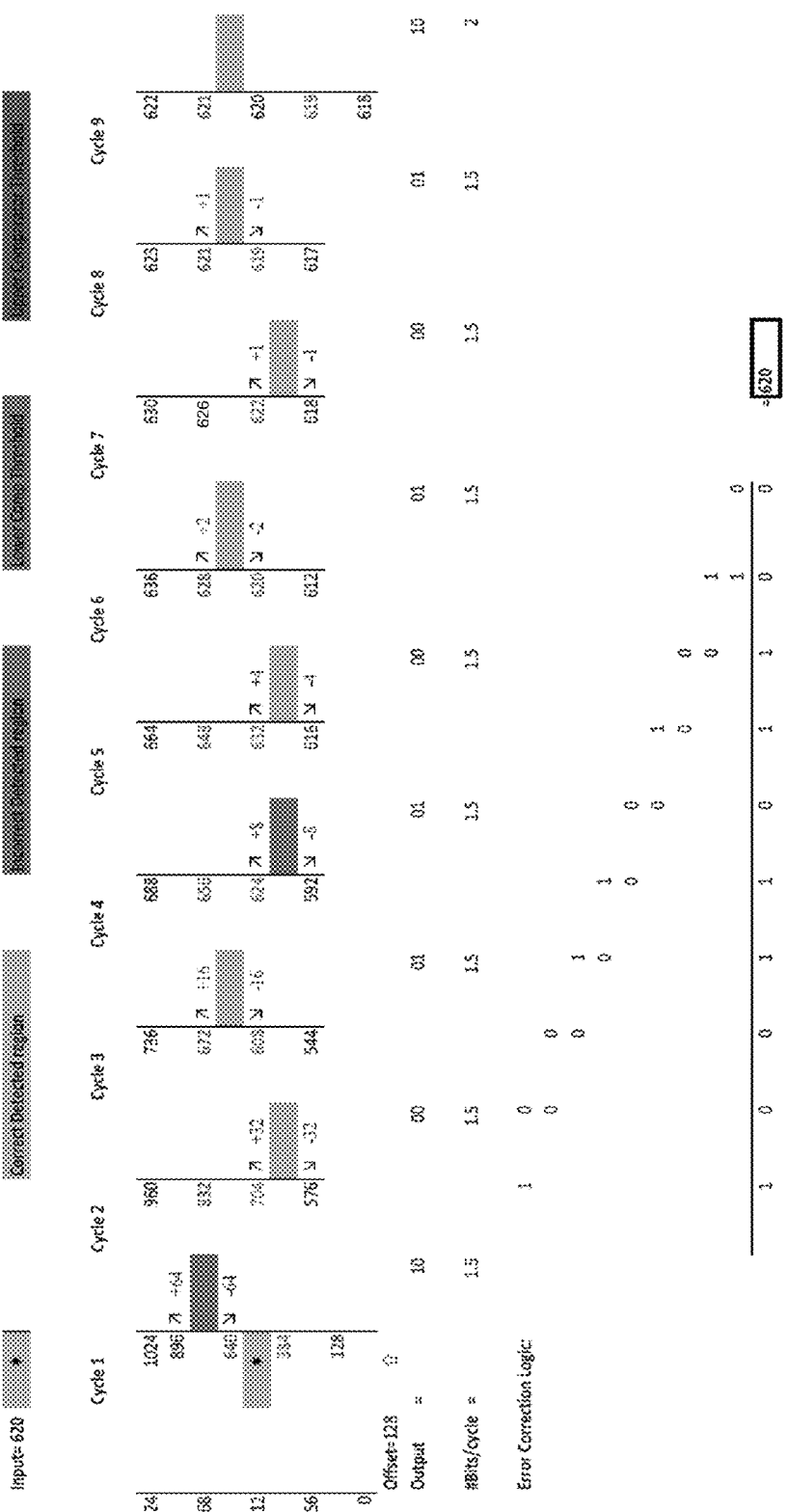
FIG. 7 is a diagram of another example conversion period, comprising a quantity of cycles, according to an implementation. The example of FIG. 7 illustrates a conversion period including two erroneous decisions, and with a correct digital conversion result.

Referring to FIG. 7, the example conversion period shows how a correct digital output can be generated using the described technique with a conventional binary scaled DAC, when 2 erroneous decision cycles (cycles 1 and 4) occur. In the example, an input of 620 mV is received. During cycle 1, the ADC 100 makes a false detection, detecting the input as between 640 and 896 (the upper region of the three regions). As shown in FIG. 7, the output code for cycle 1 is 10 instead of the correct code of 01.

In the example, the next cycle, cycle 2, has a full scale range of 960 to 576 based on adjusting the limits of the detected range (896–640) by 64 bits each. The addition of the 64 bits on either side of the detected range provides redundancy that allows the next cycle to correctly detect the input analog voltage, even though the previous cycle did not. The full scale range for cycle 2 is divided into three equal regions 128 bits apart. For cycle 2, the input is detected correctly in the lower range, producing an output of 00.

In the example, the next cycle, cycle 3, has a full scale range of 736 to 544 based on adjusting the limits of the detected range (704–576) by 32 each. The full scale range for cycle 3 is divided into three equal regions 64 bits apart. For cycle 3, the input is detected correctly in the middle range, producing an output of 01.

In the example, the pattern continues with the remaining cycles, until the last cycle, which is the $9^{th}$ cycle. As shown in FIG. 7, the last cycle includes four equally spaced regions (1 bit apart), and so it is a 2-bit cycle. In the example, the analog voltage is correctly detected in the range between 621 and 620, and the comparator (210, 212) output of the $9^{th}$ cycle is 01.

As shown in FIG. 7, the error codes are added in an overlapping (or offset) manner as described above. The result of the offset addition is the binary code 1001101100, which is equivalent to 620, the normalized input analog voltage value.

Figure 8:
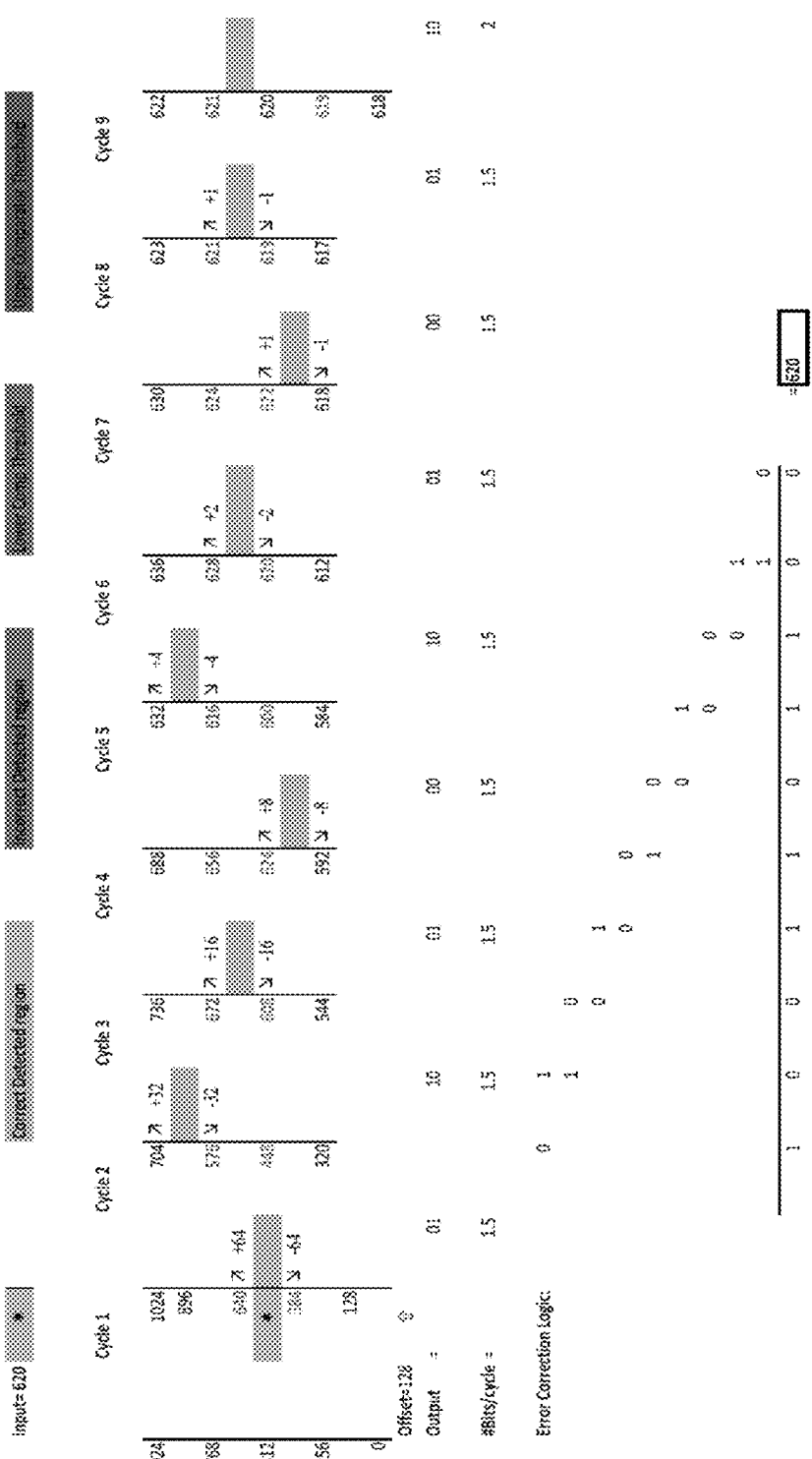
FIG. 8 is a diagram of another example conversion period, comprising a quantity of cycles, according to an implementation. The example of FIG. 8 illustrates a conversion period similar to the conversion period of FIG. 7, having the same analog input, but without erroneous decisions.

FIG. 8 is a diagram of another example conversion period, comprising a series of 9 cycles, according to an implementation. The example of FIG. 8 illustrates a conversion period similar to the conversion period of FIG. 7, having the same analog input (620 mV), but without any erroneous decisions during the conversion period. The resulting digital output of the example of FIG. 8 is the same as that of FIG. 7.

Figure 9:
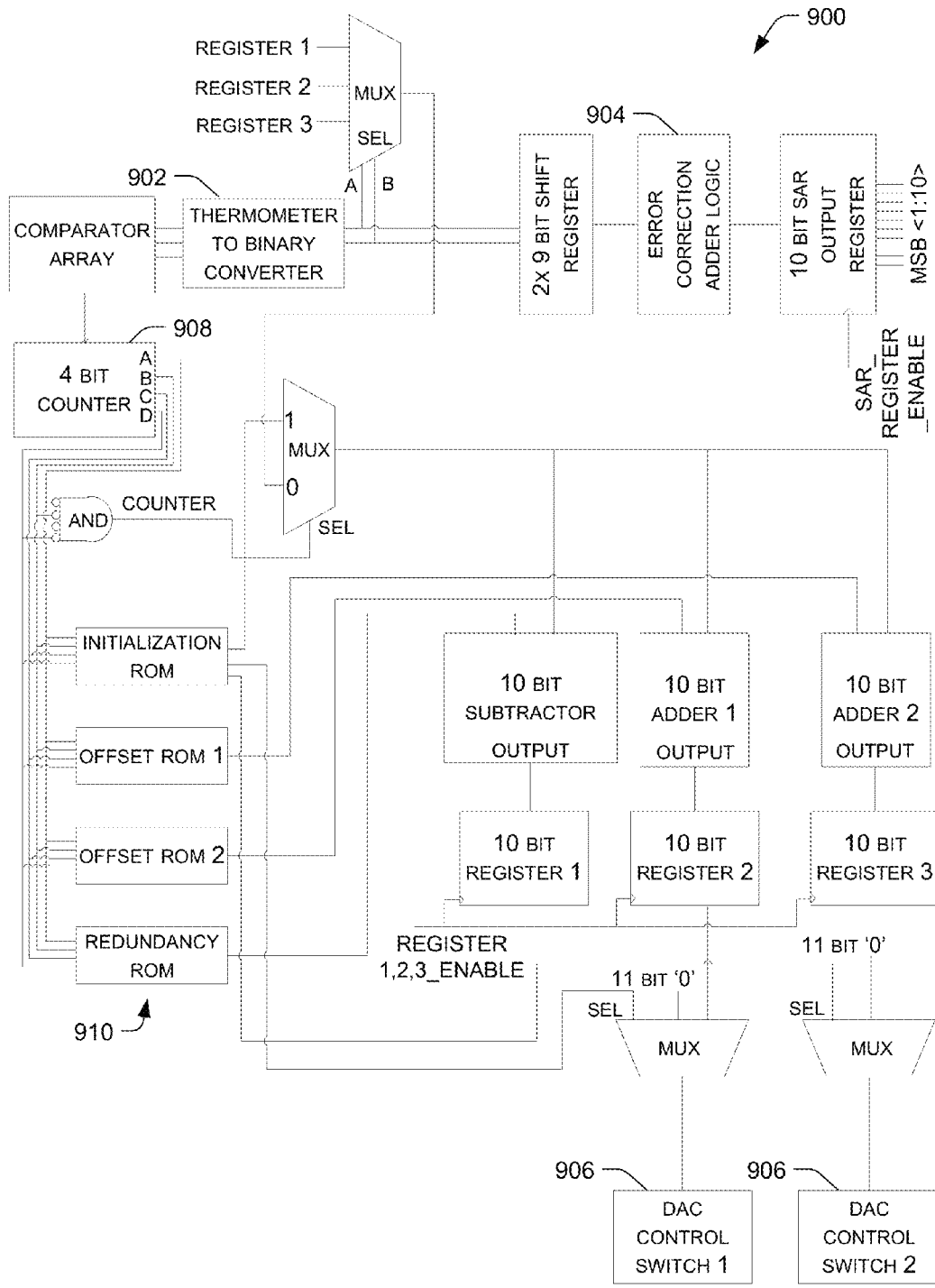
FIG. 9 is a block diagram showing an example hardware implementation of a redundant ADC arrangement, according to one implementation.

FIG. 9 is a block diagram showing an example hardware implementation 900 of an asynchronous binary redundant ADC arrangement 100, according to one implementation. As described above, the implementation 900 of FIG. 9 includes a redundant 1.5 bits per cycle architecture, with a last cycle being a 2-bit cycle. In one implementation, the arrangement 900 achieves 12.5% redundancy via nine conversion cycles, without the use of a high frequency PLL used for synchronous operation. In alternate implementations, other hardware arrangements may be used to implement the ADC arrangement 100.

In the implementation 900 of FIG. 9, two 10-bit adders, a 10-bit subtractor, a 4-bit up-counter, as well as multiplexers and registers are used to implement the binary redundant algorithm described above. Further, a thermometer to binary converter 902 is arranged to receive outputs of the first, second, and third comparators (210, 212, and 214), and to output the binary coded error correction values, as described above.

In the implementation 900 of FIG. 9, error correction adder logic 904 is arranged to add the binary coded error correction value from each cycle of the binary scaled capacitance array 200 in an overlapped (e.g., offset) arrangement, to form the multi-bit digital approximation of the analog input voltage. In an example, the error correction adder logic 904 is arranged to correct for at least four erroneous binary coded error correction values during a single conversion period to correctly generate the approximation of the analog input voltage.

In various implementations, the capacitances 202 may be switched based on control signals from one or more control components 906, such as digital logic stages, control switches, and the like. In alternate implementations, the control components 906 may be incorporated as a part of the ADC 100, or may be remote components with outputs received by the ADC 100.

In an implementation, a 4-bit counter 908 keeps track of the current cycle during the conversion period. Correspondingly, the ROM 910 loads the required values needed to be added to the lower full scale of the current cycle to generate the next upper and lower comparator thresholds (i.e. threshold 1 and threshold 2 respectively), as described above.

As discussed above, the techniques, components, and devices described herein with respect to the implementations are not limited to the illustration in FIGS. 2-9, and may be applied to other ADC 100, SAR 102, and/or DAC 104 devices and designs without departing from the scope of the disclosure. In some cases, additional or alternative components may be used to implement the techniques described herein. Further, the components may be arranged and/or combined in various combinations, while resulting in a digital output. It is to be understood that an ADC 100, SAR 102, and/or DAC 104 may be implemented as a stand-alone device or as part of another system (e.g., integrated with other components, systems, etc.).

In various implementations, additional or alternative components may be used to accomplish the disclosed techniques and arrangements.

Representative Process

Figure 10:
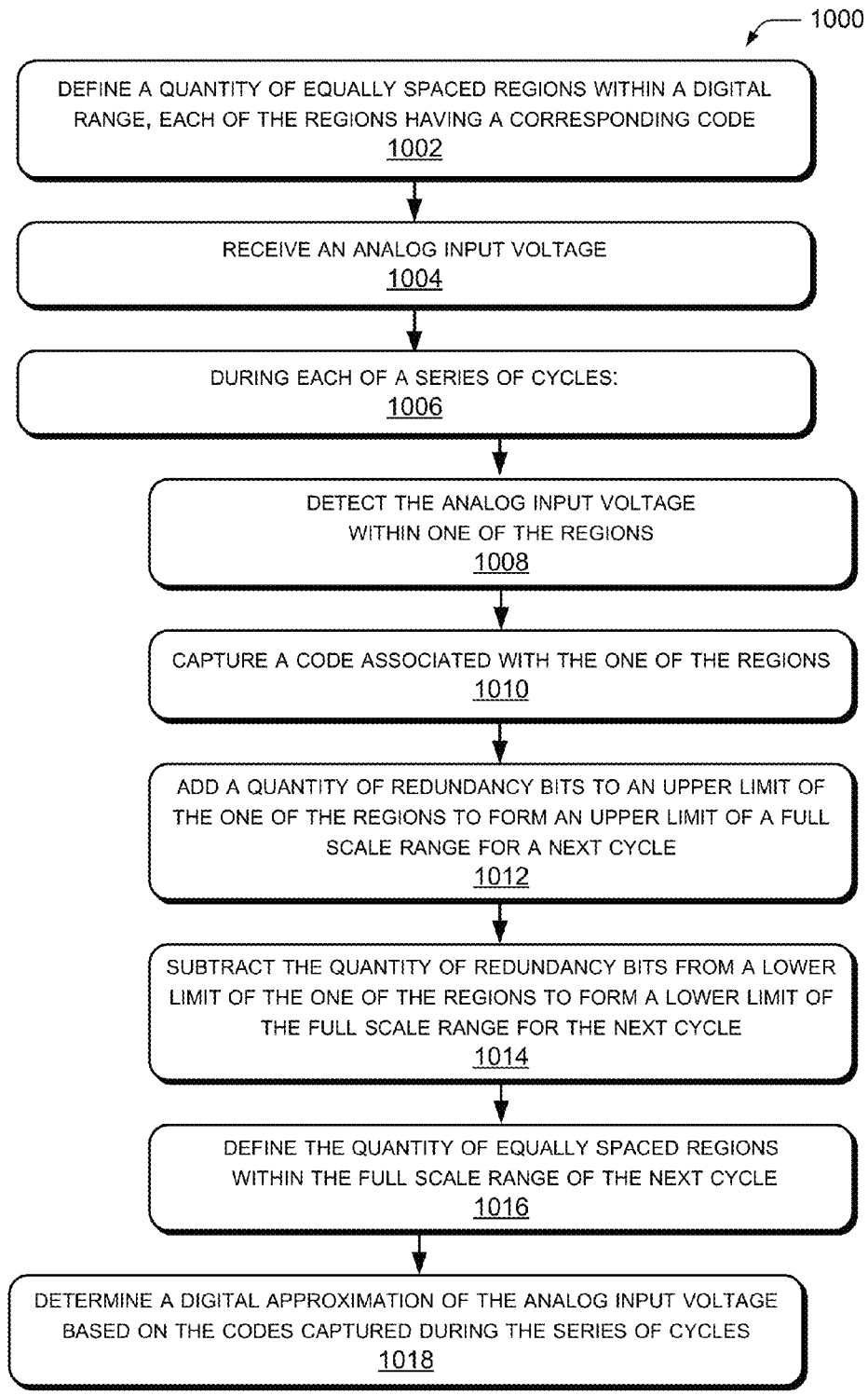
FIG. 10 is a flow diagram illustrating an example process for providing analog to digital conversion using a redundant binary scaled capacitance array arrangement, according to an implementation.

FIG. 10 is a flow diagram illustrating an example process 1000 for providing analog to digital conversion of time-discrete analog inputs, according to an implementation. The process 1000 describes using a redundant binary successive approximation algorithm with a binary successive approximation ADC (such as ADC 100). For example, a successive approximation register SAR component (such as SAR 102, for example) or a digital-to-analog conversion component (such as DAC 104, for example) may include a redundant capacitor array arrangement (such as array arrangement 200, for example). In various implementations, the bit weights of the redundant capacitor arrays are based on a predetermined binary numerical pattern. The process 1000 is described with reference to FIGS. 1-9.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

At block 1002, the process 1000 includes defining a quantity of equally spaced regions within a digital range, each of the regions having a corresponding code. For example, the corresponding code may include a 2-bit error correction code. In an implementation, the 2-bit code represents the outputs of two comparators (such as comparators 210 and 212), where each of the comparators contributes one bit of the code.

In an implementation, the process includes defining an additional upper region above the three equally spaced regions of the digital range and an additional lower region below the three equally spaced regions of the digital range. In the implementation, the additional upper region and the additional lower region determine a first pseudo-threshold of the digital range and a second pseudo-threshold of the digital range respectively.

At block 1004, the process includes receiving an analog input voltage. For example, the process includes receiving the analog input voltage at a sample and hold component, such as a capacitance array or the like.

At block 1006, the process includes performing a number of functions during each of a series of cycles: (In an implementation, the series of cycles includes nine cycles for a 10-bit output of the ADC.)

At block 1008, the process includes detecting the analog input voltage within one of the regions during each of the cycles. At block 1010, the process includes capturing a code associated with the one of the regions. For example, the process includes capturing the code associated with the region that the analog input is detected within.

At block 1012, the process includes adding a quantity of redundancy bits to an upper limit of the one of the regions to form an upper limit of a full scale range for a next cycle. At block 1014, the process includes subtracting the quantity of redundancy bits from a lower limit of the one of the regions to form a lower limit of the full scale range for the next cycle. For example, the upper and lower limits of the full scale range for the next cycle are determined by adding the quantity of redundancy bits to the upper limit of the detected region and subtracting the quantity of redundancy bits from the lower limit of the detected region.

In an implementation, the process includes dividing the quantity of redundancy bits by 2 for a successive cycle. In another implementation, the process includes storing the quantity of redundancy bits and/or the comparator threshold values in memory for each cycle.

At block 1016, the process includes defining the quantity of equally spaced regions within the full scale range of the next cycle. In an implementation, this includes defining the comparator thresholds for the next cycle. In an implementation, the process includes storing pre-subtracted values for determining the comparator thresholds for the next cycle in memory.

In an implementation, the process includes defining a greater quantity of equally spaced regions within the full scale range of the next cycle, when the next cycle comprises the last cycle. In another implementation, the process includes generating an additional threshold for an interpolating comparator during the last cycle via a transistor-based interpolation.

In one implementation, the process includes defining three equally spaced regions within the digital range, defining three equally spaced regions within the full scale range of the next cycle, and defining four equally spaced regions within the full scale range of the last cycle.

At block 1018, the process includes determining a digital approximation of the analog input voltage based on the codes captured during the series of cycles. For example, the process includes combining the codes captured during the series of cycles using an overlapping addition technique to determine the digital approximation of the analog input. In an implementation, the combining includes correcting for region detection errors of one or more of the cycles. In an implementation, the process includes correcting for at least four region detection errors during a conversion period.

In an implementation, the process includes arranging a first differential array and a second differential array to form a binary scaled capacitance array (such as array arrangement 200, for example) arranged to determine a digital approximation of an analog input voltage for an ADC. In the implementation, the process includes differentially coupling a pair of parallel capacitance arrays to a comparator to form each differential array. In the implementation, each parallel capacitance array comprises a plurality of binary weighted capacitances (such as capacitances 202, for example) coupled to a common node in a descending order of capacitance values (e.g., bit weights) according to a predetermined binary pattern. In the implementation, the common node from each parallel capacitance array comprises an input of the comparator.

In an implementation, each of the parallel capacitance arrays is substantially identical. For example, each capacitance of one array has an associated capacitance of each of the other arrays, having a substantially equivalent capacitance value or bit weight.

In an implementation, the process includes using the binary scaled capacitance array with the binary successive approximation algorithm described with respect to the blocks 1002-1018 to determine a digital approximation to an input analog value.

In alternate implementations, other techniques may be included in the process 1000 in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:
1. An apparatus, comprising:
a first differential array; and
a second differential array, each of the first and second differential arrays including:
a first array of parallel capacitances coupled to a first common node at a first terminal and arranged to be switched at a second terminal amongst a first leg of a differential reference voltage, a second leg of the differential reference voltage, or a first leg of a differential analog input voltage, the first array including a sequence of capacitances having a capacitance value that is approximately half of a capacitance value of a previous adjacent capacitance, according to a binary numerical pattern; and a second array of parallel capacitances coupled to a second common node at a first terminal and arranged to be switched at a second terminal amongst the first leg of the differential reference voltage, the second leg of the differential reference voltage, or a second leg of the differential analog input voltage, each capacitance of the first array having an associated capacitance within the second array with an approximately equivalent capacitance value, the first differential array and the second differential array in combination arranged to determine a digital approximation for the differential analog input voltage.

2. The apparatus of claim 1, the first array of parallel capacitances and the second array of parallel capacitances each further comprising an additional least significant bit (LSB) capacitance having a capacitance value that is approximately equal to a capacitance value of a previous adjacent capacitance.

3. The apparatus of claim 2, wherein a second terminal of the LSB capacitance of the first array of parallel capacitances is arranged to be switched between the second leg of the reference voltage and the first leg of the analog input voltage, and wherein a second terminal of the LSB capacitance of the second array of parallel capacitances is arranged to be switched between the first leg of the reference voltage and the second leg of the analog input voltage.

4. The apparatus of claim 1, further comprising a first comparator and a second comparator, the first common node and the second common node of the first differential array being coupled to the differential inputs of the first comparator, and the first common node and the second common node of the second differential array being coupled to the differential inputs of the second comparator.

5. The apparatus of claim 4, further comprising a third comparator, the first common nodes of the first and second differential arrays arranged to be coupled to a first differential input of the third comparator and the second common nodes of the first and second differential arrays arranged to be coupled to a second differential input of the third comparator.

6. The apparatus of claim 5, wherein combined outputs of the first, second, and third comparators represent a binary error correction value.

7. The apparatus of claim 5, wherein the third comparator comprises an interpolation comparator used during a last cycle of multiple cycles of determining the digital approximation.

8. An analog-to-digital converter (ADC), comprising:
a binary scaled capacitance array arranged to determine a digital approximation of an analog input voltage, the binary scaled capacitance array including:
a first differential array; and
a second differential array, each of the first and second differential arrays including:
a first array of parallel capacitances coupled to a first common node at a first terminal and arranged to be switched at a second terminal amongst a first leg of a differential reference voltage, a second leg of the differential reference voltage, or a first leg of a differential analog input voltage, the first array including a sequence of capacitances having a capacitance value that is approximately half of a capacitance value of a previous adjacent capacitance, according to a binary numerical pattern, and an additional least significant bit (LSB) capacitance having a capacitance value that is approximately equal to a capacitance value of a previous adjacent capacitance; and a second array of parallel capacitances coupled to a second common node at a first terminal and arranged to be switched at a second terminal amongst the first leg of the differential reference voltage, the second leg of the differential reference voltage, or a second leg of the differential analog input voltage, each capacitance of the first array having an associated capacitance within the second array with an approximately equivalent capacitance value;

a first comparator, the first common node and the second common node of the first differential array being coupled to the differential inputs of the first comparator; and a second comparator, the first common node and the second common node of the second differential array being coupled to the differential inputs of the second comparator.

9. The ADC of claim 8, further comprising a third comparator comprising an interpolation comparator used during a last cycle of multiple cycles of determining the digital approximation, the first common nodes of the first and second differential arrays arranged to be coupled to a first differential input of the third comparator and the second common nodes of the first and second differential arrays arranged to be coupled to a second differential input of the third comparator.

10. The ADC of claim 8, further comprising a thermometer to binary converter arranged to receive outputs of the first, second, and third comparators, and to output a binary coded error correction value.

11. The ADC of claim 8, wherein each of the capacitances of an array of parallel capacitances represents a bit position, and each capacitance of the binary scaled capacitance array at the bit position is processed concurrently during a cycle of the binary scaled capacitance array, resulting in a binary coded error correction value representing 1.5 bits.

12. The ADC of claim 11, further comprising error correction adder logic arranged to add the binary coded error correction value from each cycle of the binary scaled capacitance array in an overlapped arrangement, to form a multi-bit digital approximation of the analog input voltage.

13. The ADC of claim 12, wherein the error correction adder logic is arranged to correct for at least four erroneous binary coded error correction values during a single conversion period to generate the approximation of the analog input voltage.

14. A method, comprising:
defining a quantity of equally spaced regions within a digital range, each of the regions having a corresponding code;
receiving an analog input voltage;
performing during each of a series of cycles:
detecting the analog input voltage within one of the regions;
capturing a code associated with the one of the regions;
adding a quantity of redundancy bits to an upper limit of the one of the regions to form an upper limit of a full scale range for a next cycle;
subtracting the quantity of redundancy bits from a lower limit of the one of the regions to form a lower limit of the full scale range for the next cycle; and defining the quantity of equally spaced regions within the full scale range of the next cycle; and determining a digital approximation of the analog input voltage based on the codes captured during the series of cycles.

15. The method of claim 14, further comprising combining the codes captured during the series of cycles using an overlapping addition technique to determine the digital approximation of the analog input.

16. The method of claim 15, wherein the combining includes correcting for region detection errors of one or more of the cycles.

17. The method of claim 14, further comprising defining an additional upper region above the three equally spaced regions of the digital range and an additional lower region below the three equally spaced regions of the digital range, the additional upper region and the additional lower region determining a first pseudo-threshold of the digital range and a second pseudo-threshold of the digital range respectively.

18. The method of claim 14, further comprising defining a greater quantity of equally spaced regions within the full scale range of the next cycle, when the next cycle comprises the last cycle.

19. The method of claim 18, further comprising generating an additional threshold for an interpolating comparator during the last cycle via a transistor-based interpolation.

20. The method of claim 14, further comprising defining three equally spaced regions within the digital range, defining three equally spaced regions within the full scale range of the next cycle, and defining four equally spaced regions within the full scale range of the last cycle.

21. The method of claim 14, further comprising dividing the quantity of redundancy bits by 2 for a successive cycle.

22. The method of claim 14, further comprising storing the quantity of redundancy bits and/or comparator threshold values in memory for each cycle.

23. The method of claim 14, further comprising storing pre-subtracted values for determining comparator thresholds for the next cycle in memory.

24. The method of claim 14, wherein the series of cycles includes nine cycles for a 10-bit output.

* * * * *